(12) United States Patent
Tian

(10) Patent No.: US 11,391,786 B2
(45) Date of Patent: Jul. 19, 2022

(54) TEST SYSTEM AND METHOD FOR CHARGING DEVICE

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 263 days.

(21) Appl. No.: 16/628,945

(22) PCT Filed: Sep. 30, 2018

(86) PCT No.: PCT/CN2018/109087
§ 371 (c)(1),
(2) Date: Jan. 6, 2020

(87) PCT Pub. No.: WO2020/062239
PCT Pub. Date: Apr. 2, 2020

(65) Prior Publication Data
US 2021/0033682 A1    Feb. 4, 2021

(51) Int. Cl.
G01R 31/42    (2006.01)
G01R 31/36    (2020.01)
H02J 7/00     (2006.01)

(52) U.S. Cl.
CPC ............. G01R 31/42 (2013.01); G01R 31/36 (2013.01); H02J 7/0029 (2013.01)

(58) Field of Classification Search
CPC .... G01R 31/42; G01R 31/36; G01R 31/2827; G01R 31/40; G01R 27/08; G01R 31/00;
(Continued)

(56) References Cited

U.S. PATENT DOCUMENTS 5,049,803 A * 9/1991 Palanisamy ......... H02J 7/00714
320/147
5,160,880 A * 11/1992 Palanisamy ........... H02J 7/0047
320/DIG. 12

(Continued)

FOREIGN PATENT DOCUMENTS

CN      1467507 A    1/2004
CN    101527448 A    9/2009

(Continued)

OTHER PUBLICATIONS

Indian patent 202017001813, 3 pages (Year: 2020).*

(Continued)

*Primary Examiner* — Tung S Lau
(74) *Attorney, Agent, or Firm* — Young Basile Hanlon & MacFarlane, P.C.

(57) ABSTRACT

The present disclosure provides a test system and method for a charging device. The test system for the charging device includes a load module, a test board and the charging device. A path is formed between the charging device and the load module through the test board. The test board is configured to report a test battery voltage to the charging device. The charging device is configured to receive the test battery voltage, to calculate a path impedance from the charging device to the load module according to the test battery voltage, to adjust an operating state of the charging device according to the calculated path impedance, and to determine whether the charging device needs to enter a protection state, for testing a path impedance protection function of the charging device.

19 Claims, 3 Drawing Sheets

(58) Field of Classification Search
CPC .... H02J 7/0029; H02J 7/0031; H02J 7/00034;
H02J 7/0047
See application file for complete search history.

(56) References Cited

U.S. PATENT DOCUMENTS

| | | | | |
|---|---|---|---|---|
| 6,268,714 | B1* | 7/2001 | Yang | H02H 7/18 |
| | | | | 315/86 |
| 9,759,782 | B2* | 9/2017 | Rajamaki | H02J 7/0047 |
| 2010/0013430 | A1* | 1/2010 | Manor | H02J 7/00047 |
| | | | | 320/132 |
| 2017/0179741 | A1 | 6/2017 | Tian et al. | |

FOREIGN PATENT DOCUMENTS

| | | | | | |
|---|---|---|---|---|---|
| CN | 201548668 | U | | 8/2010 | |
| CN | 102901929 | A | | 1/2013 | |
| CN | 103441472 | A | * | 12/2013 | ............ H02J 7/0031 |
| CN | 106154089 | A | | 11/2016 | |
| CN | 106471697 | A | | 3/2017 | |
| CN | 106505656 | A | | 3/2017 | |
| CN | 106537724 | A | | 3/2017 | |
| CN | 106908664 | A | | 6/2017 | |
| CN | 107210615 | A | | 9/2017 | |
| CN | 107466433 | A | | 12/2017 | |
| CN | 207352137 | U | | 5/2018 | |
| EP | 3142341 | A1 | | 3/2017 | |
| EP | 3276784 | A1 | | 1/2018 | |
| JP | H1051972 | A | | 2/1998 | |
| JP | 2009128274 | A | | 6/2009 | |
| JP | 2010028876 | A | | 2/2010 | |
| JP | 2013110775 | A | | 6/2013 | |
| JP | 2014211307 | A | | 11/2014 | |
| KR | 20160136283 | A | | 11/2016 | |

OTHER PUBLICATIONS

Chinese Office Action with English Translation for CN Application 201880032796.5 dated Aug. 19, 2021. (17 pages).
Japanese Office Action with English Translation for JP Application 2020502949 dated Nov. 2, 2021. (8 pages).
OA for IN application 202017001813 dated Jul. 1, 2020.
International Search Report with English Translation for PCT/CN2018/109087 dated Jul. 5, 2019.
Communication pursuant to Article 94(3) EPC for EP Application 18935202.4 dated Nov. 24, 2021. (6 pages).
Korean Notice of Allowance with English Translation for KR Application 1020207002648 dated Nov. 30, 2021. (4 pages).
Korean Office Action with English Translation for KR Application 10-2020-7002648 dated May 21, 2021. (10 pages).
Japanese Office Action with English Translation for JP Application 2020-502949 dated Mar. 30, 2021. (14 pages).
Extended European Search Report for EP Application 18935202.4 dated Feb. 8, 2021. (9 pages).

\* cited by examiner

TEST SYSTEM AND METHOD FOR CHARGING DEVICE

CROSS-REFERENCE TO RELATED APPLICATION(S)

This application is a 371 application of International Application No. PCT/CN2018/109087, filed on Sep. 30, 2018, the entire disclosure of which is hereby incorporated by reference.

TECHNICAL FIELD

The present disclosure relates to a field of charging technology, and more particularly, to a test system for a charging device and a test method for a charging device.

BACKGROUND

In the related art, a charging device such as an adapter is tested in cooperation with an electronic device. Specifically, a resistor is coupled in series to a path between the adapter and the electronic device, and then it is observed whether the adapter has a path impedance protection function. However, problems existing in the related art are in that the resistor is manually coupled in series to the path, and thus the error is large and the operation is not convenient.

SUMMARY

Embodiment of a first aspect of the present disclosure provides a test system for a charging device. The system includes a load module, a test board and the charging device. A path is formed between the charging device and the load module through the test board. The test board is configured to execute a charging state of a battery to obtain a test battery voltage, and to report the test battery voltage to the charging device. The charging device is configured to receive the test battery voltage, to calculate path impedance from the charging device to the load module according to the test battery voltage, to adjust an operating state of the charging device according to the calculated path impedance, and to determine whether the charging device needs to enter a protection state, for testing a path impedance protection function of the charging device.

Embodiments of a second aspect of the present disclosure provides a test method for a charging device. A path is formed between the charging device and a load module through a test board. The method is applied to the charging device and includes: receiving a test battery voltage reported by the test board; calculating a path impedance from the charging device to the load module according to the test battery voltage; adjusting an operating state of the charging device according to the calculated path impedance; and determining whether the charging device needs to enter a protection state, for testing a path impedance protection function of the charging device.

Additional aspects and advantages of the present application will be given in the following description, some of which will become apparent from the following description or be learned from practices of the present application.

BRIEF DESCRIPTION OF DRAWINGS

The foregoing and/or additional aspects and advantages of the present disclosure become obvious and easily understood in descriptions of the embodiments with reference to the following accompanying drawings.

DETAILED DESCRIPTION

Figure 1:
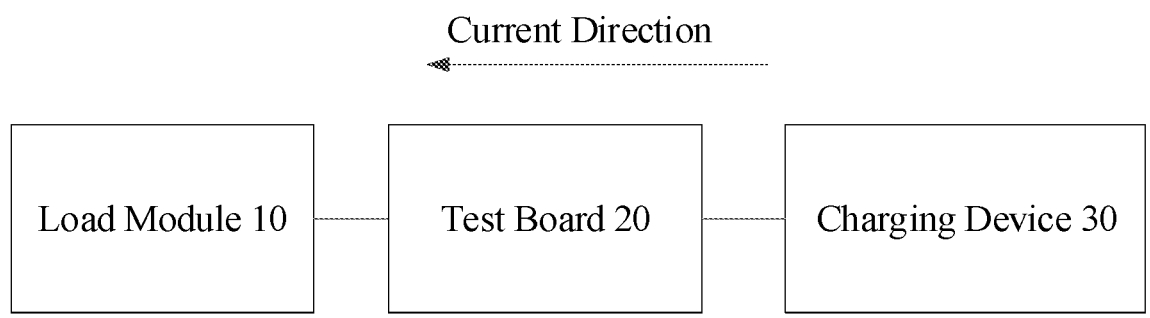
FIG. 1 is a block diagram of a test system for a charging device according to embodiments of the present disclosure.

Embodiments of the present disclosure are described below in detail, and examples of the embodiments are shown in accompanying drawings, throughout which, reference signs that are the same or similar represent the same or similar components or components that have the same or similar functions. The embodiments described below with reference to the accompanying drawings are examples, are merely used to explain the present disclosure, and cannot be construed as a limit to the present disclosure.

A test system and method for a charging device according to embodiments of the present disclosure will be described below with reference to the accompanying drawings. The test system and method for the charging device is configured to test a path impedance protection function of the charging device.

In embodiments of the present disclosure, the charging device is configured to charge an electronic device. The electronic device may refer to a terminal that may include, but is not limited to, a smartphone, a computer, a personal digital assistant (PDA), a wearable device, a Bluetooth headset, a gaming device, a camera device, and the like. The charging device may be a device having a function of charging the terminal, such as an adapter, a portable power supply (a power bank), or an in-vehicle charger. Taking the adapter as an example, the charging device may be a VOOC adapter, and a charging circuit of the VOOC adapter may be directly coupled to a battery of the electronic device through a charging interface.

It may be understood that, in order to ensure the safety of charging when the charging device charges the electronic device, the charging device is provided with a path impedance protection function, i.e., a path impedance between the charging device and a battery of the electronic device is detected. For example, the path impedance between the charging device and the battery may include a path impedance of the electronic device and a path impedance of a charging line between the charging device and the electronic device. Therefore, in actual use, the charging device acquires the path impedance between the charging device and the battery. When the path impedance between the charging device and the battery is too large, it is considered that the path impedance is abnormal, such that the charging device enters a protection state.

Therefore, the test system for the charging device provided by embodiments of the present disclosure simulates the aforementioned abnormal path impedance in a test of the charging device and checks whether the charging device enters the protection state or not. For example, a load module, a test board and the charging device are sequentially coupled in series to form a path. The test board simulates a state of the electronic device and communicates with the charging device in real time, and may intentionally produce a fault with too large path impedance (the specific method for producing the fault is described in detail later), so that the charging device may determine that the path impedance from the charging device to the load module is too high. After that, whether the charging device enters the protection state or not is checked, thereby verifying the validity of the path impedance protection function.

The test system for the charging device according to embodiments of the present disclosure will be described in detail with reference to FIGS. 1 to 4.

As illustrated in FIG. 1, a test system 100 for the charging device according to embodiments of the present disclosure includes a load module 10, a test board 20 and a charging device 30.

Figure 2:
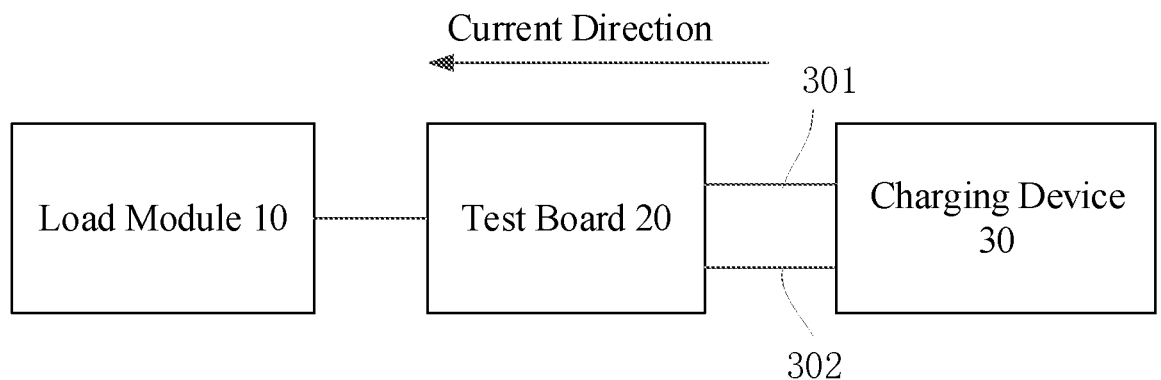
FIG. 2 is a block diagram of a test system for a charging device according to an embodiment of the present disclosure.

A path may be formed between the charging device 30 and the load module 10 through the test board 20, that is, a current output by the charging device 30 flows to the load module 10 through the test board 20, and the direction of the current is shown by the arrow in FIG. 1. Specifically, as illustrated in FIG. 2, the charging device 30 may have a power line 301 and a communication line 302. The power line 301 of the charging device 30 forms a path with the load module 10 through the test board 20, and the charging device 30 communicates with the test board 20 through the communication line 302 to receive information transmitted by the test board 20.

It should be noted that the load module 10 may be a load without a battery, and the test board 20 and the load module 10 may simulate states of the electronic device. For example, the test board 20 may simulate the state of the battery during fast charging process of the electronic device, in which the state of the battery includes a battery current, a battery voltage and the like. And then, the test board 20 reports the simulated battery state to the charging device 30, which may simulate the charging process according to the battery state reported by the test board 20. As an example, when simulating a constant current charging process in the fast charging mode, the test board 20 may upload the battery voltage to the charging device 30, so that the charging device 30 determines whether the path impedance is abnormal according to the battery voltage uploaded by the test board.

In an actual testing process, the test board 20 is configured to report the test battery voltage VBAT to the charging device 30. The charging device 30 is configured to receive the test battery voltage VBAT, to calculate a path impedance from the charging device 30 to the load module 10 according to the test battery voltage VBAT, to adjust an operating state of the charging device 30 according to the calculated path impedance, and to determine whether the charging device 30 needs to enter a protection state, for testing a path impedance protection function of the charging device 30.

That is, when the path impedance protection function is tested, the test battery voltage VBAT is determined in advance, and the battery voltage uploaded by the test board 20 is set as the test battery voltage VBAT. The charging device 30 may receive the test battery voltage VBAT reported by the test board 20 through the communication line 302, and calculate the path impedance from the charging device 30 to the load module 10 according to the test battery voltage VBAT, so as to control the operating state (including but not limited to a normal operating state, a protection state, etc.) of the charging device 30 according to the path impedance from the charging device 30 to the load module 10. After the operating state of the charging device 30 is controlled according to the path impedance from the charging device 30 to the load module 10, whether the charging device 30 enters the protection state is determined, thereby testing the path impedance protection function of the charging device 30.

As an example, after the charging device 30 enters the fast charging mode, the test board 20 may report the test battery voltage VBAT to the charging device 30. The charging device 30 may calculate the path impedance from the charging device 30 to the load module 10 according to the test battery voltage VBAT, compare the calculated path impedance with the reference impedance, and determine whether the path impedance is abnormal according to the comparison result. That is, it is determined that the path impedance is abnormal when the difference between the calculated path impedance and the reference impedance is greater than the preset impedance. When the path impedance protection function of the charging device 30 is normal and the path impedance is abnormal, the charging device 30 enters the protection state. When the path impedance protection function of the charging device 30 fails (or is invalid) or the path impedance is normal, the charging device 30 is in the normal operating state.

It may be understood that, since the charging device 30 determines whether the path impedance is abnormal according to the battery voltage that may be reported by the test board 20, the test board 20 may report a false battery voltage, i.e. the test battery voltage VBAT, to simulate an abnormality that the path impedance is too high. That is, a setting principle of the false battery voltage VBAT is that the difference between the path impedance calculated by the charging device 30 according to the false battery voltage VBAT and the reference impedance is greater than the preset impedance.

Furthermore, when the path impedance protection function of the charging device 30 is tested, the test board 20 may report the false battery voltage VBAT to the charging device 30, and in this case, whether the charging device 30 has the path impedance protection function is determined by determining whether the charging device 30 will enter the protection state. When the charging device enters the protection state, it is determined that the charging device has the path impedance protection function or the path impedance protection function is valid, and when the charging device does not enter the protection state, it is determined that the charging device does not have the path impedance protection function or the path impedance protection function fails.

Consequently, whether the path impedance protection function of the charging device is valid or not may be effectively tested with easy operation and high accuracy. And further, the safety and stability of the charging device may be ensured, preventing after-sale problems of the charging device caused by malfunction of the path impedance protection function and guaranteeing the quality of the charging device.

According to an embodiment of the present disclosure, the charging device 30 calculates the path impedance from the charging device 30 to the load module 10 according to a charging voltage of the charging device 30, the test battery voltage VBAT reported by the test board 20, and a charging current of the charging device 30. When the path impedance protection function is normal and the calculated difference between the path impedance and the reference impedance is greater than the preset impedance, the charging device 30 enters the protection state.

It should be noted that the charging device 30 may pre-record the reference impedance, and the reference impedance may be a value of the path impedance under normal conditions. For example, the reference impedance may include a sum of a pre-recorded path impedance of the load module 10 and a pre-recorded path impedance of the charging line between the charging device 30 and the load module 10. For example, since the load modules 10 of the same model are identical in structure, path impedances of the load modules 10 may be set to the same value. In addition, the preset impedance may be a maximum allowable fluctuation value with respect to the reference impedance.

It may be understood that the path impedance from the charging device 30 to the load module 10 may include the path impedance of the load module 10 and the path impedance of the charging line between the charging device 30 and the load module 10.

After the charging device 30 obtains the test battery voltage VBAT reported by the test board 20, the path impedance from the charging device 30 to the load module 10 may be calculated according to the charging voltage and the charging current of the charging device 30 and the test battery voltage VBAT. When the path impedance protection function is normal and the difference between the calculated path impedance and the reference impedance is greater than the preset impedance, the charging device 30 enters the protection state.

Specifically, the path impedance R from the charging device 30 to the load module 10 may be equal to the difference between the charging voltage VBAT of the charging device 30 and the test battery voltage VBAT divided by the charging current I of the charging device 30, that is, the path impedance from the charging device 30 to the load module 10 may be calculated by the charging device 30 according to the following equation:

$$R=(VBUS-VBAT)/I$$

where, R is the path impedance from the charging device 30 to the load module 10, VBUS is the charging voltage of the charging device 30, VBAT is the test battery voltage reported by the test board 20, and I is the charging current of the charging device 30.

In an embodiment of the present disclosure, the test board 20 may sample the voltage on the test board, and calculate the test battery voltage VBAT according to the voltage V-ADC on the test board, a simulate impedance increment ΔR and the charging current I of the charging device 30. The simulate impedance increment ΔR is greater than or equal to the preset impedance.

Specifically, the test battery voltage VBAT may be equal to the voltage V-ADC on the test board minus a product of the simulate impedance increment and the charging current I of the charging device, i.e., the test board 20 may calculate the test battery voltage according to the following equation:

$$VBAT=V-ADC-\Delta R*I$$

where, VBAT is the test battery voltage, V-ADC is the voltage on the test board 20, ΔR is the simulate impedance increment, and I is the charging current of the charging device 30.

It may be understood that after the charging device 30 enters the fast charging mode, the test board 20 may sample the voltage V-ADC on the board as a present battery voltage VBAT' and report the present battery voltage VBAT' to the charging device 30. The charging device 30 calculates the path impedance from the charging device 30 to the load module 10 according to the equation R=(VBUS−VBAT')/I. The charging device 30 records the reference impedance and then determines whether the path impedance is abnormal by calculating an increment of the path impedance (i.e., the calculated path impedance minus the reference impedance) in the present state.

Since the charging device 30 determines whether the impedance is abnormal according to the reported present battery voltage VBAT', a false battery voltage, such as the test battery voltage VBAT, may be reported, so that the charging device 30 may determine that the increment of the path impedance exceeds the preset impedance. For example, assuming that the simulate impedance increment ΔR is required, the voltage on the board collected by the test board 20 may be modified to the test battery voltage VBAT=V-ADC−ΔR*I according to the present charging current I of the charging device 30.

Therefore, by reporting the false battery voltage to the charging device 30 to simulate a fault of the path impedance, an automatic test may be realized, which is easy to operate and has a high accuracy.

In a specific example of the present disclosure, the load module 10 may be a constant voltage load, so that the charging current of the charging device 30 is in a constant current state. For example, when the load module 10 is an electronic load, the electronic load is in a constant voltage mode to keep a voltage of the electronic load constant. Since the voltage of the load module 10 is constant, the charging current of the charging device 30 changes only with the charging voltage of the charging device 30. When the charging voltage of the charging device 30 is kept constant, the charging current of the charging device 30 is in the constant current state, thereby further simplifying the operation.

A specific structure of the test system for the charging device is described below.

Figure 3:
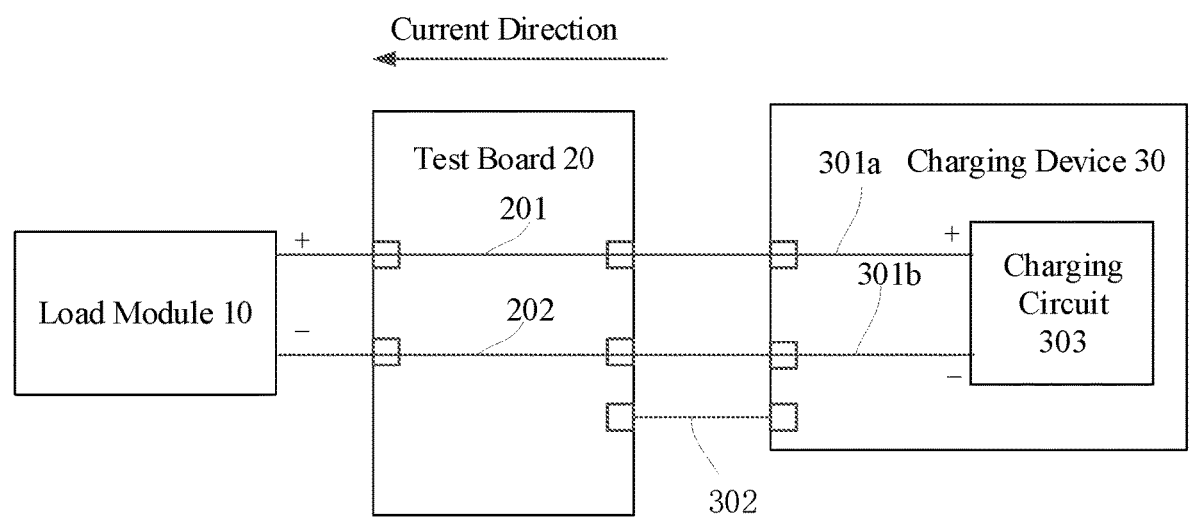
FIG. 3 is a block diagram of a test system for a charging device according to another embodiment of the present disclosure.

As illustrated in FIGS. 2 and 3, the charging device 30 has the power line 301. The charging device 30 may output power to the outside through the power line 301, for example, to charge a battery of the electronic device or to transmit power to the load module 10. Specifically, as illustrated in FIG. 3, the power line 301 may include a positive power line 301a and a negative power line 301b, and the test board 20 has a first power line 201 and a second power line 202. A first end of the first power line 201 of the test board 20 is coupled to a positive electrode of the load module 10, and a second end of the first power line 201 of the test board 20 is coupled to the positive power line 301a of the charging device 30. A first end of the second power line 202 of the test board 20 is coupled to a negative electrode of the load module 10, and a second end of the second power line 202 of the test board 20 is coupled to the negative power line 301b of the charging device 30.

The positive power line 301a may also be coupled to a positive output terminal + of a charging circuit 303 in the charging device 30, and the negative power line 301b may also be coupled to a negative output terminal— of the charging circuit 303 in the charging device 30.

It may be understood that the current flows out of the positive output terminal + of the charging circuit 303 in the charging device 30, then flows into the positive terminal of the load module 10 through the positive power line 301a and the first power line 201 in sequence before flowing out of the positive terminal of the load module 10, and finally flows back to the negative output terminal—of the charging circuit 303 in the charging device 30 through the second power line 202 and the negative power line 301b in sequence.

As an example, when the charging device 10 is coupled to an electronic device, the positive power line 301a and the negative power line 301b may be coupled to the anode and the cathode of the battery, respectively, to charge the battery of the electronic device.

In some embodiments, the charging device may include a voltage detection circuit and a current detection circuit. The voltage detection circuit may be configured to sample a voltage on the positive power line 301a of the charging device 30 to obtain the charging voltage of the charging device 30, and send the sampled voltage value to the control module 304. In some embodiments, the voltage detection circuit may sample the voltage on the positive power line 301a by dividing the voltage through series connection. The current detection circuit may be configured to sample the current on the positive power line 301a or the negative power line 301b to obtain the charging current of the charging device 30, and to send the sampled current value to the control module 304. In some embodiments, the current detection circuit may sample and detect the current on the positive power line 301a or the negative power line 301b through a current sensing resistor and a galvanometer.

After obtaining the test battery voltage VBAT reported by the test board 20, the charging device 30 may calculate the path impedance from the charging device 30 to the load module 10 according to the voltage value sampled by the voltage detection circuit, the current value sampled by the current detection circuit, and the test battery voltage VBAT. When the path impedance protection function is normal and the difference between the calculated path impedance and the reference impedance is greater than preset impedance, the charging device 30 enters the protection state.

As illustrated in FIGS. 2 and 3, the charging device 30 further has a communication line 302. The charging device 30 communicates with the test board 20 through the communication line 302, to receive the test battery voltage VBAT. As an example, the power line 301 and the communication line 302 may be arranged in the same data cable, which may be a USB cable, thereby facilitating connection between the charging device and the test board.

Figure 4:
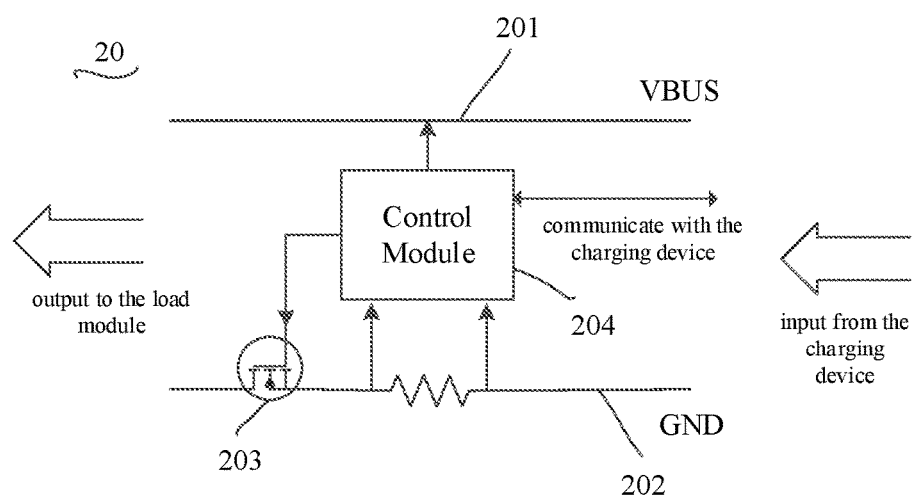
FIG. 4 is a block diagram of a test system for a charging device according to yet another embodiment of the present disclosure.

As illustrated in FIG. 4, the test board 20 further includes a switch tube 203 and a control module 204. The switch tube is coupled in series with the first power line 201 or the second power line 202. The control module 204 is coupled to a control electrode of the switch tube 203, and the control module 204 controls the path from the charging device 30 to the load module 10 to switch on or off by controlling the switch tube 203 to switch on or off.

It may be understood that when the switch tube 203 is switched on, the path from the charging device 30 to the load module 10 is switched on, and the charging device 30 outputs power to the load module 10. When the switch tube 203 is switched off, the path from the charging device 30 to the load module 10 is switched off, and the charging device 30 stops outputting power to the load module 10.

The control module 203 is coupled to the control electrode of the switch tube 203. When the charging device 30 is tested for the path impedance protection function, the switch tube 203 may be switched on under the control of the control module 204. The switch tube 203 may be a MOS transistor or a triode. The control module 102 may be an MCU (micro-controller unit).

In some embodiments of the present disclosure, the charging device 30 may further send a reply message to the test board 20. The reply message is configured to indicate the operating state of the charging device 30, or indicate whether the charging device 30 is in the protection state, or indicate a test result of a test on the path impedance protection function.

It may be understood that, when the reply message is configured to indicate whether the charging device 30 is in the protection state, the charging device 30 may send a result of whether the charging device 30 is in the protection state to the test board 20 after calculating the path impedance according to the test battery voltage reported by the test board 20 and adjusting the operating state of the charging device 30 according to the calculated path impedance. Then, the test board 20 determines whether the charging device 30 has the path impedance protection function according to the result of whether the charging device 30 is in the protection state. That is, when the charging device enters the protection state, it is determined that the charging device has the path impedance protection function, and when the charging device does not enter the protection state, it is determined that the charging device does not have the path impedance protection function.

When the reply message is configured to indicate the operating state of the charging device 30, the charging device 30 may send the operating state of the charging device 30 to the test board 20 after calculating the path impedance according to the test battery voltage reported by the test board 20 and adjusting the operating state of the charging device 30 according to the calculated path impedance. The test board 20 determines whether the charging device 30 is in the protection state according to the received operating state of the charging device 30. When the charging device enters the protection state, it is determined that the charging device has the path impedance protection function, and when the charging device does not enter the protection state, it is determined that the charging device does not have the path impedance protection function.

When the reply message is configured to indicate the test result of test on the path impedance protection function, the charging device 30 may determine whether the charging device 30 is in the protection state after calculating the path impedance according to the test battery voltage reported by the test board 20 and adjusting the operating state of the charging device 30 according to the calculated path impedance. When the charging device enters the protection state, it is determined that the charging device has the path impedance protection function. When the charging device does not enter the protection state, it is determined that the charging device does not have the path impedance protection function. The test result is then sent to the test board 20.

In some embodiments, the test board 20 may be further coupled to a prompt device. After determining whether the charging device has the path impedance protection function, the test board 20 may control the prompt device to send a prompt message, thereby facilitating a user to visually know the test result. As an example, the prompt device may be a display.

In summary, according to the test system for the charging device provided by embodiments of the present disclosure, the power line of the charging device forms the path with the load module through the test board, and the charging device receives the battery voltage reported by the test board through the communication line, and determines whether the charging device enters the protection state when determining that the impedance of the path is greater than preset impedance according to the battery voltage reported by the test board, thereby testing the path impedance protection function of the charging device. Consequently, whether the path impedance protection function of the charging device is valid may be effectively tested with easy operation and high accuracy. And further, the safety and stability of the charging device may be ensured, preventing after-sale problems of the charging device caused by malfunction of the path impedance protection function and guaranteeing the quality of the charging device.

Corresponding to the test system for the charging device in the foregoing embodiment, the present disclosure further provides a test method for a charging device.

Figure 5:
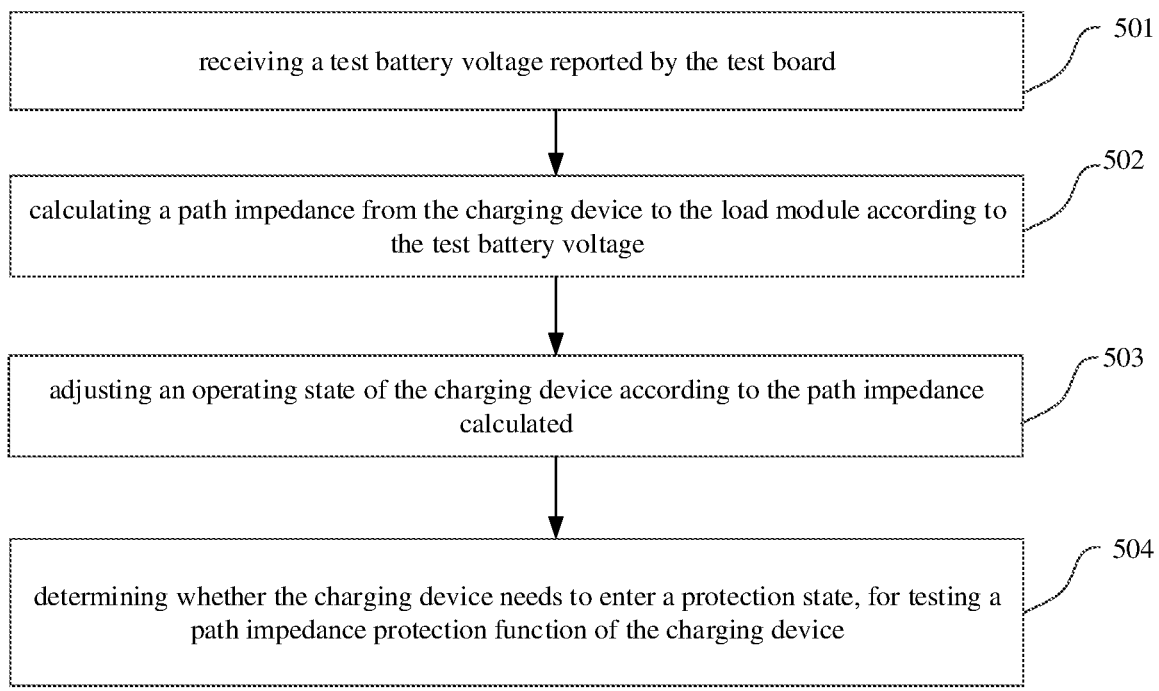
FIG. 5 is a flow chart of a test method for a charging device according to embodiments of the present disclosure.

FIG. 5 is a flow chart of a test method for a charging device according to embodiments of the present disclosure. A path is formed between the charging device and a load module through a test board. As illustrated in FIG. 5, the test method for the charging device includes the followings.

At block 501, a test battery voltage reported by the test board is received.

The test battery voltage may be obtained by the test board by executing a charging state of a battery.

At block 502, a path impedance from the charging device to the load module is calculated according to the test battery voltage.

At block 503, an operating state of the charging device is adjusted according to the calculated path impedance.

At block 504, it is determined whether the charging device needs to enter a protection state, for testing a path impedance protection function of the charging device.

According to an embodiment of the present disclosure, calculating the path impedance from the charging device to the load module according to the test battery voltage includes: calculating the path impedance from the charging device to the load module according to a charging voltage of the charging device, the test battery voltage reported by the test board and a charging current of the charging device, wherein when the path impedance protection function is normal and the calculated difference between the path impedance and the reference impedance is greater than the preset impedance, the charging device enters the protection state.

According to an embodiment of the present disclosure, the path impedance from the charging device to the load module is calculated according to the formula of R=(VBUS−VBAT)/I, where R is the path impedance from the charging device to the load module, VBUS is the charging voltage of the charging device, VBAT is the test battery voltage reported by the test board, and I is the charging current of the charging device.

According to an embodiment of the present disclosure, the test battery voltage is calculated by the test board according to a voltage on the test board, a simulate impedance increment and the charging current of the charging device.

According to an embodiment of the present disclosure, the test battery voltage is calculated by the test board according to the formula of VBAT=V-ADC−ΔR*I, where VBAT is the test battery voltage, V-ADC is the voltage on the test board, ΔR is the simulate impedance increment, and I is the charging current of the charging device.

According to an embodiment of the present disclosure, the simulate impedance increment is greater than or equal to the preset impedance.

According to an embodiment of the present disclosure, the load module is a constant voltage load, such that a charging current of the charging device is in a constant current state.

It should be noted that the above explanation of the embodiments of the test system for the charging device is also applicable to the test method for the charging device according to this embodiment, and no repetition is made herein.

In summary, according to the test method for the charging device provided by embodiments of the present disclosure, the charging device forms the path with the load module through the test board, receives the test battery voltage reported by the test board, calculates the path impedance from the charging device to the load module according to the test battery voltage for adjusting the operating state of the charging device according to the calculated path impedance, and determines whether the charging device enters the protection state for testing the path impedance protection function of the charging device. In addition, the difference between the path impedance calculated according to the test battery voltage and the reference impedance is greater than the preset impedance. Consequently, whether the path impedance protection function of the charging device is valid may be effectively tested with easy operation and high accuracy. And further, the safety and stability of the charging device may be ensured, preventing after-sale problems of the charging device caused by malfunction of the path impedance protection function and guaranteeing the quality of the charging device.

Those skilled in the art could be aware that, example units and algorithm steps described in combination with embodiments disclosed herein may be implemented by electronic hardware, or by a combination of computer software and electronic hardware. Whether these functions are executed by hardware or software is dependent on particular use and design constraints of the technical solutions. Professionals may adopt different methods for different particular uses to implement described functions, which should not be regarded as going beyond the scope of the present disclosure.

It is clear to those skilled in the art that, for convenience and brevity of description, specific operating processes of the system, device and unit described above may refer to corresponding processes in the foregoing method embodiments, and are not described herein again.

In several embodiments provided by the present disclosure, it should be understood that, the disclosed system, device and method may be implemented in other ways. For example, the device embodiments described above are merely illustrative. For example, the units are merely divided according to logic functions, and can be divided in other ways in actual implementation. For example, a plurality of units or components may be combined or may be integrated into another system, or some features may be ignored or not executed. In addition, the mutual coupling or direct coupling or communication connection illustrated or discussed may be via some interfaces, or direct coupling or communication connection of devices or units may be in an electrical, mechanical, or other form.

The units described as separate parts may or may not be physically separated. Parts displayed as units may or may not be physical units, i.e., the parts may be located in one place, or may be distributed on a plurality of network units. Some or all of the units can be selected according to actual needs to achieve purposes of solutions of the embodiments.

Moreover, respective functional units in respective embodiments of the present disclosure may be integrated in one processing unit, or the respective units may be separate physical existence, or two or more units may be integrated in one unit.

If the functions are realized in form of functional software units and are sold or used as separate products, they can be stored in a computer readable storage medium. Based on this understanding, the parts of the technical solutions or the essential parts of the technical solutions (i.e. the parts making a contribution to the related art) can be embodied in form of software product, which is stored in a storage medium, and includes several instruction used for causing a computer device (for example, a personal computer, a server or a network device) to execute all or part of steps in the methods described in respective embodiments of the present disclosure. The above storage medium may be any medium capable of storing program codes, including a USB flash disk, a mobile hard disk, a Read-Only Memory (ROM), a Random Access Memory (RAM), a disc, or a light disk.

Above description is merely specific implementation of the present disclosure. However, the protection scope of the present disclosure is not limited to this. Any change or substitute that is conceivable by those skilled in the art should be in the protection scope of the present disclosure. Thus, the protection scope of the present disclosure should be defined as the protection scope of claims.

What is claimed is:

1. A test system for a charging device, comprising a load module, a test board and the charging device, a path being formed between the charging device and the load module through the test board, wherein,
    the test board is configured to execute a charging state of a battery to obtain a test battery voltage, and to report the test battery voltage to the charging device; and
    the charging device is configured to receive the test battery voltage, to calculate a path impedance from the charging device to the load module according to the test battery voltage, to adjust an operating state of the charging device, and to determine whether the charging device needs to enter a protection state according to the path impedance calculated for testing a path impedance protection function of the charging device.

2. The test system for the charging device according to claim 1, wherein the charging device is configured to calculate the path impedance from the charging device to the load module according to a charging voltage of the charging device, the test battery voltage reported by the test board and a charging current of the charging device;
    wherein, the charging device is configured to enters the protection state when the path impedance protection function is normal and a difference between the path impedance calculated and a reference impedance is greater than a preset impedance.

3. The test system for the charging device according to claim 2, wherein the charging device is configured to calculate the path impedance from the charging device to the load module according to a formula of $R = (VBUS - VBAT)/I$ where, R is the path impedance from the charging device to the load module, VBUS is the charging voltage of the charging device, VBAT is the test battery voltage reported by the test board, and I is the charging current of the charging device.

4. The test system for the charging device according to claim 1, wherein the test board is configured to sample a voltage on the test board, and calculate the test battery voltage according to the voltage on the test board, a simulate impedance increment and a charging current of the charging device.

5. The test system for the charging device according to claim 4, wherein the test board is configured to calculate the test battery voltage according to a formula of $VBAT = V\text{-}ADC - \Delta R * I$ where, VBAT is the test battery voltage, V-ADC is the voltage on the test board, $\Delta R$ is the simulate impedance increment, and I is the charging current of the charging device.

6. The test system for the charging device according to claim 4, wherein the simulate impedance increment is greater than or equal to a preset impedance.

7. The test system for the charging device according to claim 1, wherein the charging device is configured to charge the load module in a constant current.

8. The test system for the charging device according to claim 1, wherein the charging device comprises power lines with a positive power line and a negative power line, and the test board comprises a first power line and a second power line, in which
    a first end of the first power line of the test board is coupled to a positive electrode of the load module, and a second end of the first power line of the test board is coupled to the positive power line of the charging device; and
    a first end of the second power line of the test board is coupled to a negative electrode of the load module, and a second end of the second power line of the test board is coupled to the negative power line of the charging device.

9. The test system for the charging device according to claim 8, wherein the test board further comprises a switch tube and a control module, the switch tube is coupled to the first power line or the second power line, the control module is coupled to a control electrode of the switch tube, and the control module is configured to control a path from the charging device to the load module to switch on or off by controlling the switch tube to switch on or off.

10. The test system for the charging device according to claim 8, wherein the charging device further comprises a communication line, the charging device is configured to communicate with the test board through the communication line, for receiving the test battery voltage.

11. The test system for the charging device according to claim 10, wherein the power lines and the communication line are arranged in a same data cable.

12. The test system for the charging device according to claim 11, wherein the data cable is a USB cable.

13. A test method for a charging device, applied to the charging device, a path being formed between the charging device and a load module through a test board, and the method comprising:
    receiving a test battery voltage reported by the test board, wherein the test battery voltage is obtained by the test board by executing a charging state of a battery;
    calculating a path impedance from the charging device to the load module according to the test battery voltage;
    adjusting an operating state of the charging device according to the path impedance calculated; and
    determining whether the charging device needs to enters a protection state, for testing a path impedance protection function of the charging device.

14. The test method for the charging device according to claim 13, wherein calculating the path impedance from the charging device to the load module according to the test battery voltage comprises:
    calculating the path impedance from the charging device to the load module according to a charging voltage of the charging device, the test battery voltage reported by the test board and a charging current of the charging device;

wherein, the charging device enters the protection state when the path impedance protection function is normal and a difference between the path impedance calculated and a reference impedance is greater than a preset impedance.

15. The test method for the charging device according to claim 14, wherein the path impedance from the charging device to the load module is calculated according to a formula of $$R=(VBUS-VBAT)/I$$

where, R is the path impedance from the charging device to the load module, VBUS is the charging voltage of the charging device, VBAT is the test battery voltage reported by the test board, and I is the charging current of the charging device.

16. The test method for the charging device according to claim 13, wherein the test battery voltage is calculated by the test board according to a voltage on the test board, a simulate impedance increment and a charging current of the charging device.

17. The test method for the charging device according to claim 16, wherein the test battery voltage is calculated by the test board according to a formula of $$VBAT=V\text{-}ADC-\Delta R*I$$

where, VBAT is the test battery voltage, V-ADC is the voltage on the test board, $\Delta R$ is the simulate impedance increment, and I is the charging current of the charging device.

18. The test method for the charging device according to claim 16, wherein the simulate impedance increment is greater than or equal to the a preset impedance.

19. The test method for the charging device according to claim 14, further comprising:

charging the load module in a constant current for executing a charging state of the battery.

* * * * *